US012575101B2

(12) United States Patent
Clampitt et al.

(10) Patent No.: US 12,575,101 B2
(45) Date of Patent: Mar. 10, 2026

(54) VERTICAL NON-VOLATILE MEMORY WITH LOW RESISTANCE SOURCE CONTACT

(71) Applicant: Micron Technology, Inc., Boise, ID (US)

(72) Inventors: Darwin A. Clampitt, Wilder, ID (US); Wesley O. Mckinsey, Nampa, ID (US); John Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 733 days.

(21) Appl. No.: 17/816,651

(22) Filed: Aug. 1, 2022

(65) Prior Publication Data

US 2023/0397419 A1    Dec. 7, 2023

Related U.S. Application Data

(60) Provisional application No. 63/365,734, filed on Jun. 2, 2022.

(51) Int. Cl.
| | |
|---|---|
| *H01L 23/498* | (2006.01) |
| *G11C 5/06* | (2006.01) |
| *G11C 16/04* | (2006.01) |
| *H01L 21/762* | (2006.01) |
| *H01L 21/768* | (2006.01) |
| *H01L 23/00* | (2006.01) |
| *H01L 23/495* | (2006.01) |
| *H10B 41/27* | (2023.01) |
| *H10B 43/27* | (2023.01) |
| *H10B 51/10* | (2023.01) |

(Continued)

(52) U.S. Cl.
CPC ......... *H10B 43/27* (2023.02); *G11C 16/0483* (2013.01); *H01L 21/76229* (2013.01); *H01L 21/76232* (2013.01); *H10B 41/27* (2023.02)

(58) Field of Classification Search
CPC ........ H10B 43/27; H10B 41/27; H10B 43/35; H10B 41/35; H10B 43/30; H10B 41/30; H10B 41/41; G11C 16/0483; H10D 30/0321–0327; H10D 30/6745; H01L 21/76894; H01L 21/76232; H01L 21/76229
See application file for complete search history.

(56) References Cited

U.S. PATENT DOCUMENTS

| | | | | |
|---|---|---|---|---|
| 9,209,031 B2 * | 12/2015 | Baenninger | ........... | H01L 21/306 |
| 9,455,263 B2 * | 9/2016 | Zhang | .................... | H10B 41/41 |

(Continued)

*Primary Examiner* — Wael M Fahmy
*Assistant Examiner* — Aneesa Riaz Baig
(74) *Attorney, Agent, or Firm* — Holland & Hart LLP

(57) ABSTRACT

For manufacturing a memory device, a system may form a trench between a first portion and a second portion of a stack. A bottom wall of the trench may include a spacer material. The system may remove a first and a second oxide material to reform the trench, and remove a polysilicon material in a lateral direction to expose a third oxide material and a channel structure. The third oxide material may form the bottom wall of the trench. The system may remove, in a lateral direction, the first oxide material, a portion of the second oxide material, the third oxide material, and a fourth oxide material of the channel structure. The system may deposit a metal material, in the trench, in contact with a doped polysilicon material of the channel structure.

21 Claims, 21 Drawing Sheets

(51) Int. Cl.
   | | | |
   |---|---|---|
   | *H10B 51/20* | (2023.01) | |
   | *H10H 20/852* | (2025.01) | |
   | *H10H 20/857* | (2025.01) | |

(56) References Cited

U.S. PATENT DOCUMENTS

| | | | | |
|---|---|---|---|---|
| 9,711,532 | B2 * | 7/2017 | Miyamoto | H10B 43/27 |
| 9,748,267 | B2 * | 8/2017 | Zhang | H10B 43/35 |
| 10,438,966 | B2 * | 10/2019 | Shioda | H10B 43/10 |
| 2017/0033121 | A1 * | 2/2017 | Miyamoto | H01L 23/528 |
| 2019/0067317 | A1 * | 2/2019 | Shioda | H10D 30/63 |
| 2021/0280595 | A1 * | 9/2021 | Hopkins | H10B 41/27 |
| 2021/0408031 | A1 * | 12/2021 | Sharangpani | H10B 41/35 |
| 2022/0238684 | A1 * | 7/2022 | Lindemann | H10B 43/35 |
| 2023/0209831 | A1 * | 6/2023 | Hopkins | H10B 43/35 |
| | | | | 257/288 |
| 2023/0377652 | A1 * | 11/2023 | Hopkins | H10B 41/10 |
| 2023/0386575 | A1 * | 11/2023 | Li | H10B 43/10 |
| 2023/0395422 | A1 * | 12/2023 | Fukuzumi | H10B 43/27 |
| 2023/0397418 | A1 * | 12/2023 | Teo | H10B 43/27 |

* cited by examiner

310

300

310

310-a

312

300

312

304-e

322

300

319   321

322

300

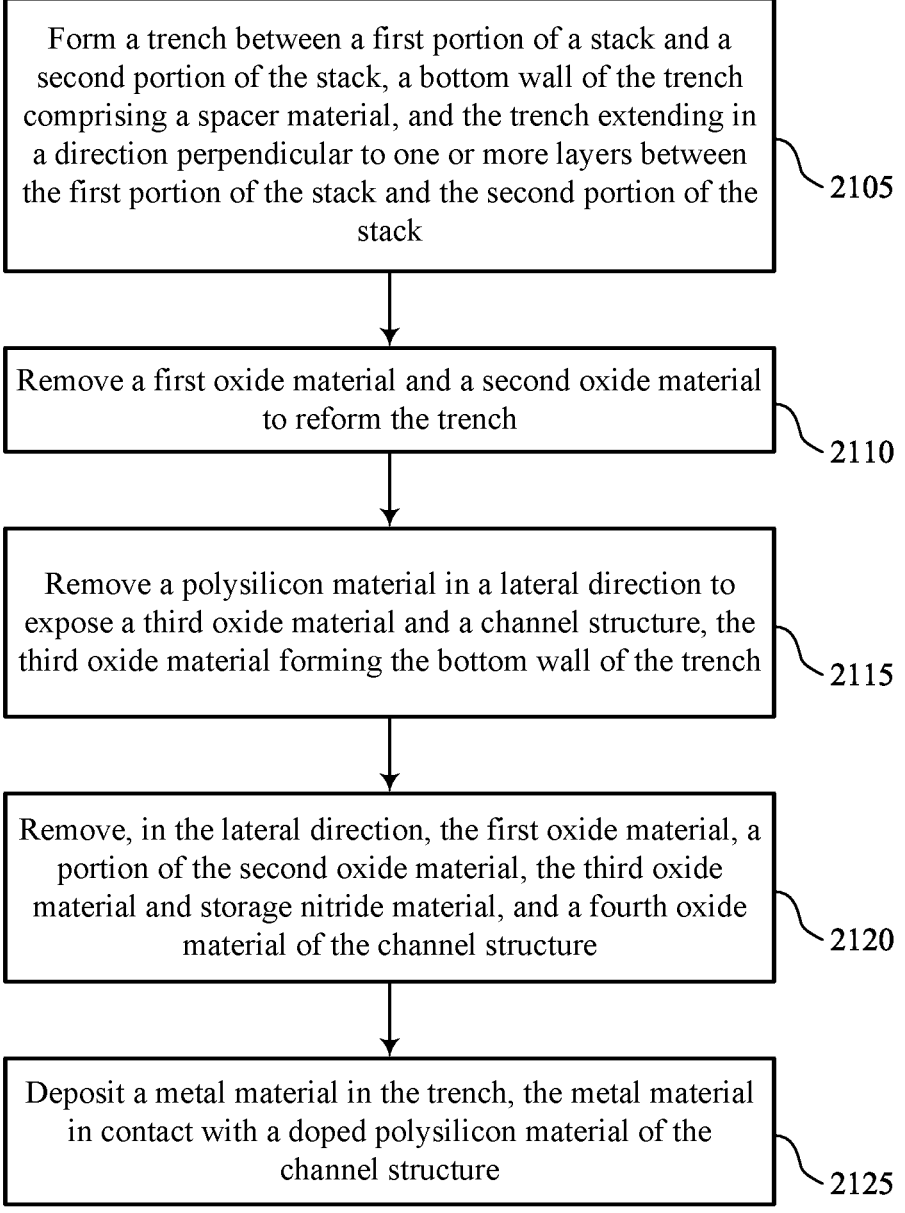

Form a trench between a first portion of a stack and a second portion of the stack, a bottom wall of the trench comprising a spacer material, and the trench extending in a direction perpendicular to one or more layers between the first portion of the stack and the second portion of the stack

2105

Remove a first oxide material and a second oxide material to reform the trench

2110

Remove a polysilicon material in a lateral direction to expose a third oxide material and a channel structure, the third oxide material forming the bottom wall of the trench

2115

Remove, in the lateral direction, the first oxide material, a portion of the second oxide material, the third oxide material and storage nitride material, and a fourth oxide material of the channel structure

2120

Deposit a metal material in the trench, the metal material in contact with a doped polysilicon material of the channel structure

VERTICAL NON-VOLATILE MEMORY WITH LOW RESISTANCE SOURCE CONTACT

CROSS REFERENCE

The present application for patent claims the benefit of U.S. Provisional Patent Application No. 63/365,734 by Clampitt et al., entitled "VERTICAL NON-VOLATILE MEMORY WITH LOW RESISTANCE SOURCE CONTACT," filed Jun. 2, 2022, assigned to the assignee hereof, and expressly incorporated by reference herein.

FIELD OF TECHNOLOGY

The following relates to one or more systems for memory, including vertical non-volatile memory with low resistance source contact.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

BRIEF DESCRIPTION OF THE DRAWINGS

FIGS. 20 and 21 show flowcharts illustrating a method or methods that support vertical non-volatile memory with low resistance source contact in accordance with examples as disclosed herein.

DETAILED DESCRIPTION

Figure 1:
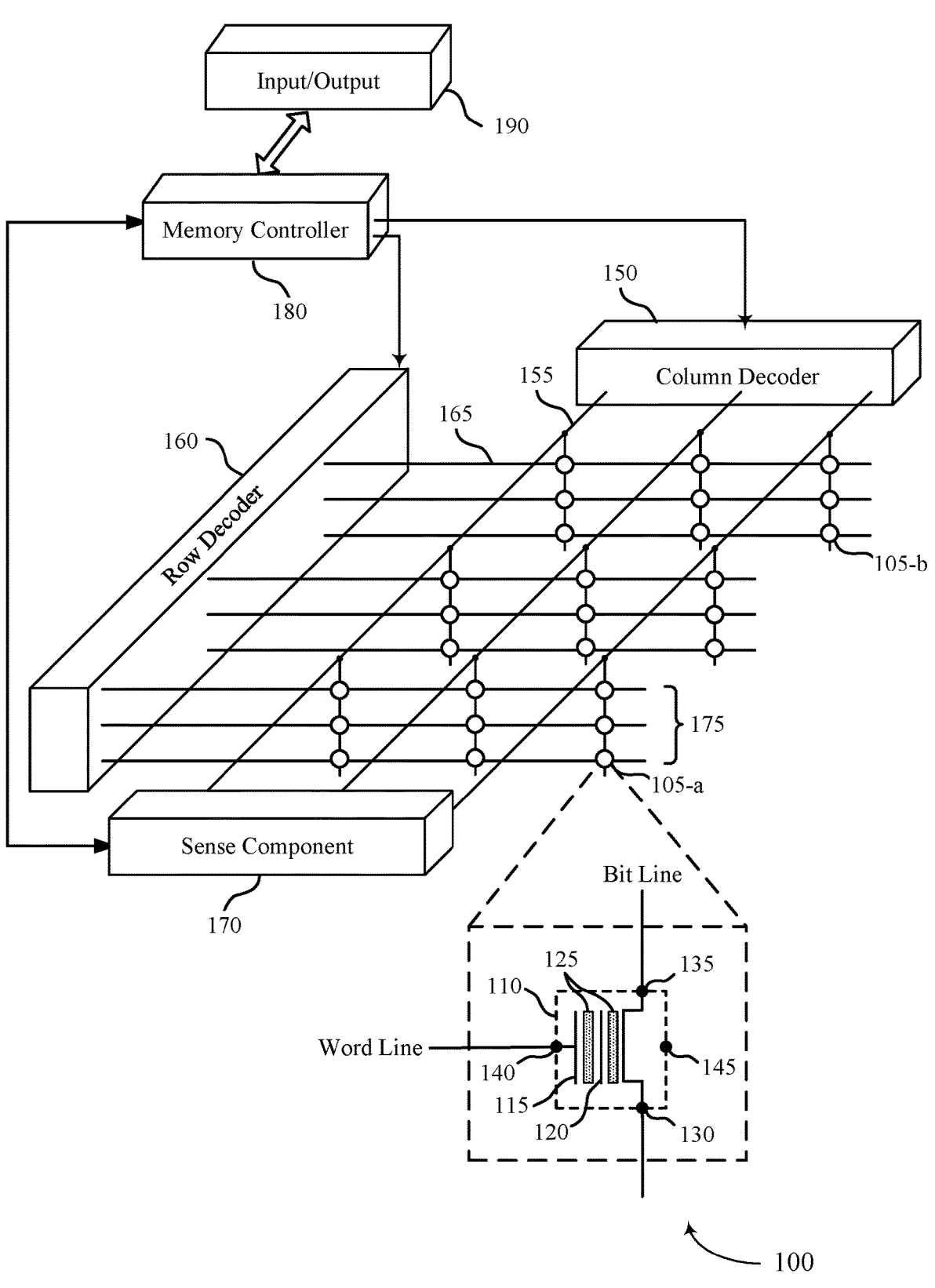
FIG. 1 illustrates an example of a system that supports vertical non-volatile memory with low resistance source contact in accordance with examples as disclosed herein.

A memory device may support various operations and may be operable to receive, transmit, or execute commands and store or read data related to components of the memory device. In some examples, the memory device may be a non-volatile memory device including multiple non-volatile memory cells. An example of a non-volatile memory device may include a not-AND (NAND) device. A NAND device may be implemented in accordance with various NAND architectures. As demand for higher memory storage and lower memory footprint increases, some semiconductor manufacturing operations result in a NAND device with a NAND architecture that implements higher number of memory cells on a single channel structure of the NAND architecture. However, as the length of the channel structure increases so does the resistance associated with the channel structure. The increased resistance may pose challenges for efficient operation of the NAND device due to difficulties in performing operations (e.g., read, write, store) on the memory cells of the channel structure. For example, as the length of the channel structure increases, it may take additional time to perform access operations using the channel.

In accordance with examples as disclosed herein, one or more semiconductor manufacturing operations that result in a non-volatile memory device with lower resistance are described. The manufacturing operations may include using lateral contact flows to establish an electrical coupling between the channel structure and a source line.

The one or more semiconductor manufacturing operations may include forming a trench between a first portion of a stack and a second portion of the stack based on removing one or more layers of a set of layers between the first portion of the stack and the second portion of the stack. The set of layers may include one or more of a dielectric layer, an oxide layer, a polysilicon layer, a metal layer, among other examples. A bottom wall of the trench may include a spacer material. The trench may extend in a direction perpendicular to the one or more layers of the set of layers between the first portion of the stack and the second portion of the stack. The one or more semiconductor manufacturing operations may include removing the spacer material positioned as the bottom wall of the trench exposing a first oxide material. The first oxide material forming the bottom wall of the trench.

Additionally, the one or more semiconductor manufacturing operations may include removing the first oxide material and a second oxide material to reform the trench and to expose a polysilicon material as the bottom wall of the trench. The one or more semiconductor manufacturing operations may include removing the polysilicon material in a lateral direction to expose a third oxide material and a channel structure. The third oxide material forming the bottom wall of the trench, and the channel structure and the stack for forming a plurality of memory cells. The one or more semiconductor manufacturing operations may include removing, in the lateral direction, the first oxide material, a portion of the second oxide material, the third oxide material (and removing a nitride material (e.g., in storage nitride)), and a fourth oxide material of the channel structure. The one or more semiconductor manufacturing operations may include depositing a metal material in the trench. The metal material in contact with a doped polysilicon material of the channel structure.

Accordingly, the memory device may include deposited metal material in contact with a doped polysilicon material of a channel structure of memory cells associated with the memory device that may reduce the resistance associated with the channel structure of the memory device.

Figure 2:
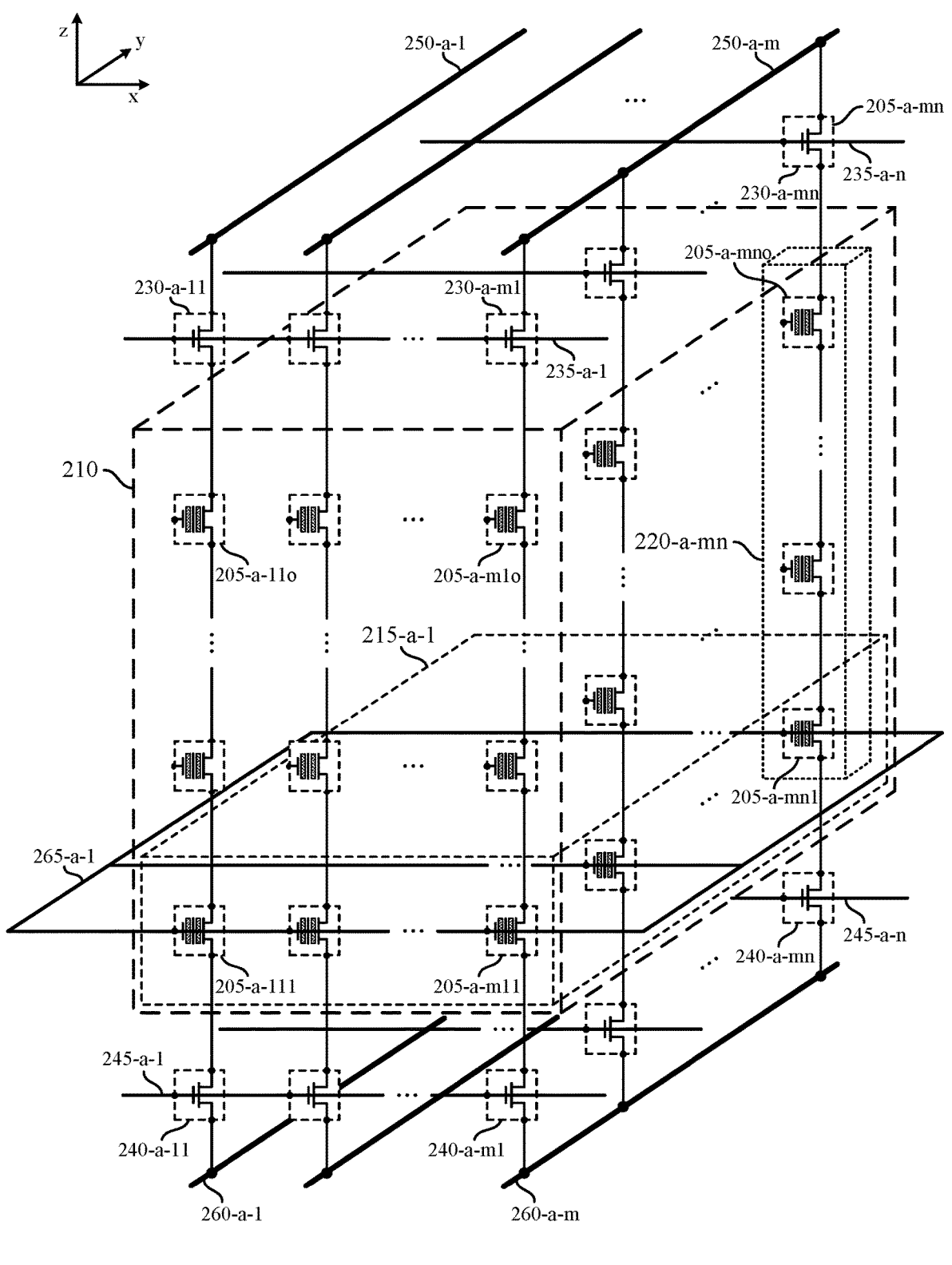
FIG. 2 illustrates an example of a memory architecture that supports vertical non-volatile memory with low resistance source contact in accordance with examples as disclosed herein.

Features of the disclosure are initially described in the context of a memory device and memory architecture with reference to FIGS. 1 and 2. Features of the disclosure are described in the context of cross-sectional views of a memory with reference to FIGS. 3 through 19. These and other features of the disclosure are further illustrated by and described in the context of flowcharts that relate to vertical non-volatile memory with low resistance source contact with reference to FIGS. 20 and 21.

FIG. 1 illustrates an example of a memory device 100 that supports vertical non-volatile memory with low resistance source contact in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-a and memory cell 105-b. In some examples, a memory cell 105 may be a NAND memory cell, such as in the blow-up diagram of memory cell 105-a. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-a that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-a is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line

155, one memory cell 105 may be accessed. Upon accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some examples, a memory device 100 may be a non-volatile memory device including multiple non-volatile memory cells (e.g., memory cells 105). An example of a non-volatile memory device may include a NAND device. The memory device 100 may be implemented in accordance with various NAND architecture. In some cases, the memory device 100 may implement a high number of memory cells on a single channel structure of a memory architecture of the memory device 100. However, as the channel structure increases so does the resistance associated with the channel structure. The increased resistance may pose challenges for efficient operation of the memory device 100.

The memory device 100 including the memory cells 105 may be associated with a stack including a set of layers as described with reference to FIGS. 3 through 19. The memory device 100 including the memory cells 105 may include a trench between a first portion of the stack and a second portion of the stack. A bottom wall of the trench may include an oxide material. The trench may extend in a direction perpendicular to one or more layers of the set of layers between the first portion of the stack and the second portion of the stack. A pair of sidewalls of the trench may include a polysilicon material or an oxide material, or both. The trench may include deposited metal material in contact with a doped polysilicon material of a channel structure of the memory cells 105 that may reduce the resistance associated with the memory device 100.

FIG. 2 illustrates an example of a memory architecture 200 that supports vertical non-volatile memory with low resistance source contact in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood by a person having ordinary skill in the art to be similar. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-a-ijk). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-a-1 associated with memory cells 205-a-111 through 205-a-mnl. In some examples, each page 215 may be associated with a same word line 265, (e.g., a word line 165 described with reference to FIG. 1), which may be coupled with a control gate 115 of each of the memory cells 205 of the page 215. For example, page 215-a-1 may be associated with a word line 265-a-1, and other pages 215-a-i may be associated with a different respective word line 265-a-i (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-a-mn associated with memory cells 205-a-mnl through 205-a-mno. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from in accordance with a granularity, such as at the granularity of the page 215, but may not be erasable (e.g., reset to a logic 1 value) in accordance with the granularity, such as the granularity of the page 215. For example, NAND memory may instead be erasable in accordance with a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of a block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistor 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistor 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, voltages may be concurrently applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 (e.g., a pillar channel) may be electrically connected with (e.g., electrically connected between) the corresponding bit line 250 and source line 260. A channel may be an electrical path through the memory cells 205 in the string 220 (e.g., through the sources and drains of the transistors in the memory cells 205 of the string 220) that may conduct current under some operating conditions.

In some examples, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic 0). Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-a of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-a of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some cases, electron injection and removal processes associated with program and erase operations may cause stress on a memory cell 205 (e.g., on the dielectric material 125). Over time, such stress may in some cases cause one or more aspects of the memory cell 205 (e.g., the dielectric material 125) to deteriorate. For example, charge trapping structure 120 may become unable to maintain a stored charge. Such deterioration may be an example of a wearout mechanism for a memory cell 205, and for this or other reasons, some memory cells 205 may support a finite quantity of program and erase cycles.

The memory architecture 200 may include a stack including a set of layers as described with reference to FIGS. 3 through 19. The memory architecture 200 including the memory cells 205 may include a trench between a first portion of the stack and a second portion of the stack. A bottom wall of the trench may include an oxide material. The trench may extend in a direction perpendicular to one or more layers of the set of layers between the first portion of the stack and the second portion of the stack. A pair of sidewalls of the trench may include a polysilicon material or an oxide material, or both. The trench may include deposited metal material in contact with a doped polysilicon material of a channel structure of the memory cells 105 that may reduce the resistance associated with the memory architecture 200.

Figure 3:
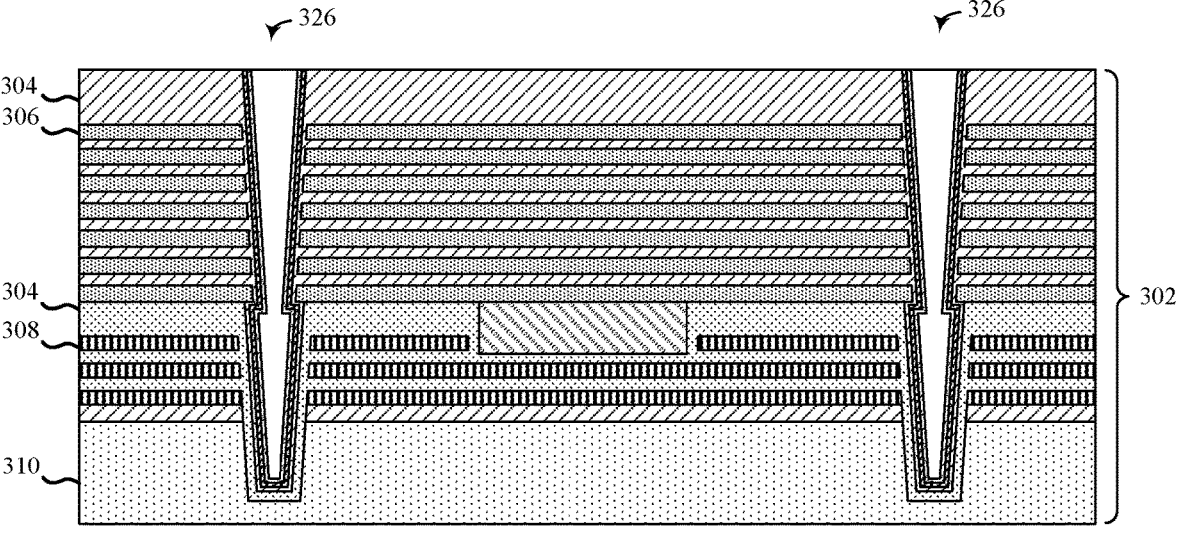
FIGS. 3 through 19 illustrates examples of cross-sectional views of a memory architecture after one or more manufacturing operations in accordance with examples as disclosed herein.

FIG. 3 illustrates an example of a cross-sectional view of a memory architecture 300 after one or more manufacturing operations in accordance with examples as disclosed herein. The memory architecture 300 may implement aspects of the memory device 100 or may be implemented by aspects of the memory device 100 as described with reference to FIG. 1. For example, one or more memory cells 105 of the memory device 100 may correspond to one or more elements of the memory architecture 300. Additionally or alternatively, the memory architecture 300 may implement aspects of the memory architecture 200 or may be implemented by aspects of the memory architecture 200 as described with reference to FIG. 2.

In the following description of FIG. 3, although some elements included in FIG. 3 are labeled with a numeric indicator, some other corresponding elements are not labeled, even though they are the same or would be understood to be similar, in an effort to increase visibility and clarity of the depicted features. Additionally, in the following description of FIG. 3, some manufacturing operations may be performed in a different order than the example order described, or some manufacturing operations may be performed in different orders or at different times. Some manufacturing operations may also be omitted with reference to FIG. 3, and other manufacturing operations may be added with reference to FIG. 3.

Some memory architectures, for example, NAND architectures may implement higher number of memory cells on a single channel structure of the NAND architecture. As a length of the channel structure increases so does a resistance associated with the channel structure. The increased resistance may pose challenges for efficient operation of the NAND architectures due to difficulties in performing operations (e.g., read, write, store) on the memory cells of the channel structure.

In accordance with examples as disclosed herein, one or more manufacturing operations that result in a memory architectures with lower resistance are described. The memory architecture may include deposited metal material in contact with a doped polysilicon material of a channel structure of memory cells associated with the memory architecture that may reduce the resistance associated with the channel structure of the memory architecture.

One or more manufacturing operations for forming the memory architecture 300 may include forming a stack 302, which may include one or more layers. In some cases, the one or more manufacturing operations for forming the stack

302 may include forming the stack 302 over a substrate. The substrate may be a semiconductor wafer or other substrate over which the stack 302 including the one or more layers is formed (e.g., deposited). One or more of the layers of the stack 302 may include an oxide material 304, a dielectric material 306, a polysilicon material 308 (e.g., polycrystalline silicon), a metal material 310, or a channel structure 326, or any combination thereof. In some examples, the oxide material 304 may include silicon dioxide (SiO2). In some examples, the dielectric material 306 may include silicon nitride material (Si₃N₄). In some examples, the metal material 310 may include Titanium Nitride (TiN), Tungsten (W), among other examples. In some other examples, the metal material 310 may include 64 TiN W.

Figure 4:
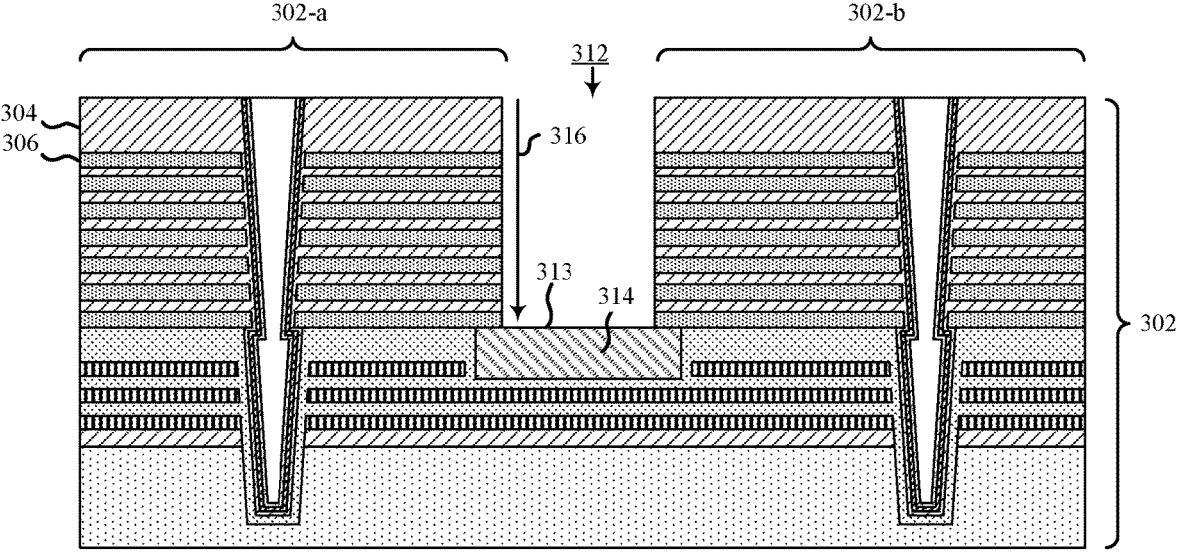

FIG. 4 illustrates an example of a cross-sectional view of a memory architecture 300 after one or more manufacturing operations in accordance with examples as disclosed herein. In the following description of FIG. 4, although some elements included in FIG. 4 are labeled with a numeric indicator, some other corresponding elements are not labeled, even though they are the same or would be understood to be similar with reference to FIG. 3, in an effort to increase visibility and clarity of the depicted features. Additionally, in the following description of FIG. 4, some manufacturing operations may be performed in a different order than the example order described, or some manufacturing operations may be performed in different orders or at different times. Some manufacturing operations may also be omitted with reference to FIG. 4, and other manufacturing operations may be added with reference to FIG. 4.

One or more of the manufacturing operations may include forming a trench 312 between a first portion 302-a of the stack 302 and a second portion 302-b of the stack 302. In some examples, one or more of the manufacturing operations for forming the trench 312 may include removing one or more layers of the stack 302 between the first portion 302-a of the stack 302 and the second portion 302-b of the stack 302. For example, one or more of the manufacturing operations for forming the trench 312 may include removing (e.g., via an etching operation) one or more layers of the oxide material 304 or the dielectric material 306, or both. In some cases, one or more of the manufacturing operations may include leaving an etch stop intact. For example, a bottom wall 313 of the trench 312 may include a spacer material 314. The trench 312 may extend in a direction 316 (e.g., y-direction) perpendicular to the one or more layers between the first portion 302-a of the stack 302 and the second portion 302-b of the stack 302.

Figure 5:
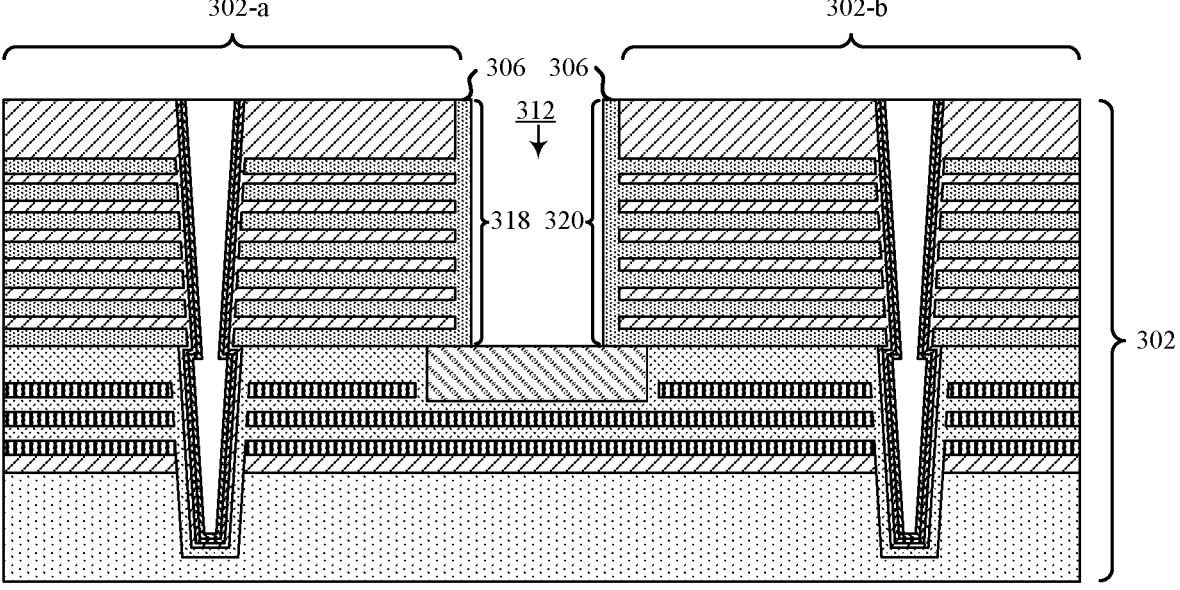

FIG. 5 illustrates an example of a cross-sectional view of a memory architecture 300 after one or more manufacturing operations in accordance with examples as disclosed herein. In the following description of FIG. 5, although some elements included in FIG. 5 are labeled with a numeric indicator, some other corresponding elements are not labeled, even though they are the same or would be understood to be similar with reference to FIGS. 3 and 4, in an effort to increase visibility and clarity of the depicted features. Additionally, in the following description of FIG. 5, some manufacturing operations may be performed in a different order than the example order described, or some manufacturing operations may be performed in different orders or at different times. Some manufacturing operations may also be omitted with reference to FIG. 5, and other manufacturing operations may be added with reference to FIG. 5.

One or more of the manufacturing operations may include depositing a dielectric material 306 on a first sidewall 318 of the trench 312 formed by the first portion 302-*a* of the stack 302 and the dielectric material 306 on a second sidewall 320 of the trench 312 formed by the second portion 320-*b* of the stack 302. For example, one or more of the manufacturing operations may include depositing, based at least in part on forming the trench 312, the dielectric material 306 on the first sidewall 318 of the trench 312 formed by the first portion 302-*a* of the stack 302 and the dielectric material 306 on the second sidewall 320 of the trench 312 formed by the second portion 302-*b* of the stack 302. One or more of the manufacturing operations may include depositing the dielectric material 306 into the trench 312 and subsequently performing an etching operation, such as a dry etching that results in the dielectric material 306 on the first sidewall 318 of the trench 312 formed by the first portion 302-*a* of the stack 302 and the dielectric material 306 on the second sidewall 320 of the trench 312 formed by the second portion 320-*b* of the stack 302.

Figure 6:
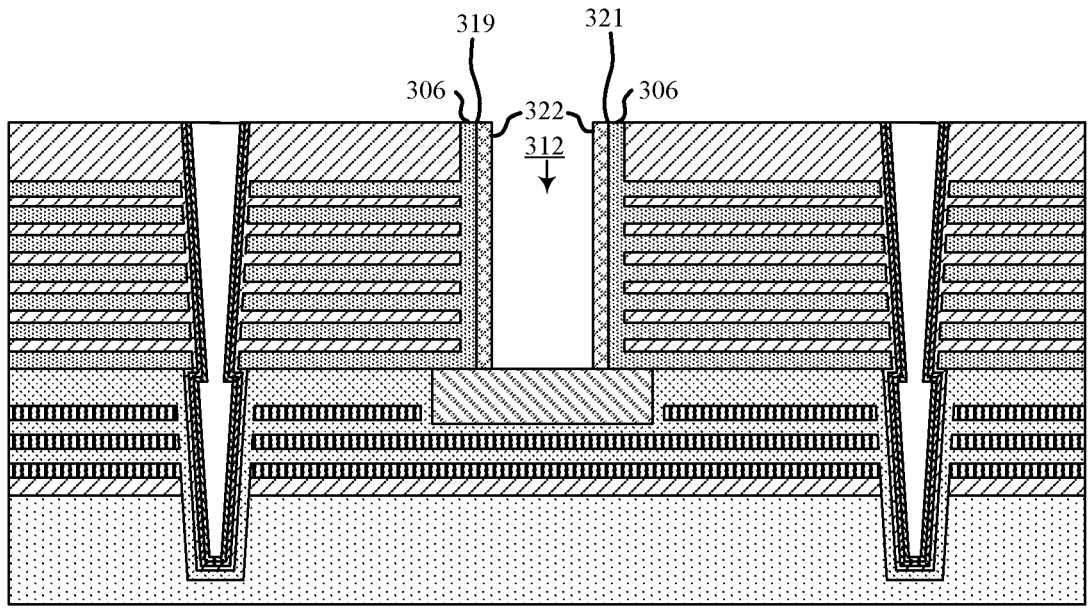

FIG. 6 illustrates an example of a cross-sectional view of a memory architecture 300 after one or more manufacturing operations in accordance with examples as disclosed herein. In the following description of FIG. 6, although some elements included in FIG. 6 are labeled with a numeric indicator, some other corresponding elements are not labeled, even though they are the same or would be understood to be similar with reference to FIGS. 3 through 5, in an effort to increase visibility and clarity of the depicted features. Additionally, in the following description of FIG. 6, some manufacturing operations may be performed in a different order than the example order described, or some manufacturing operations may be performed in different orders or at different times. Some manufacturing operations may also be omitted with reference to FIG. 6, and other manufacturing operations may be added with reference to FIG. 6.

One or more of the manufacturing operations may include depositing a polysilicon material 322 on a first sidewall 319 of the dielectric material 306 and a second sidewall 321 of the dielectric material 306. In some examples, one or more of the manufacturing operations may include depositing the polysilicon material 322 on the first sidewall 319 of the dielectric material 306 and the second sidewall 321 of the dielectric material 306 after (e.g., based at least in part on) depositing the dielectric material 306 into the trench 312. In some examples, one or more of the manufacturing operations may include depositing the polysilicon material 322 into the trench 312 and subsequently performing an etching operation, such as a dry etching that results in the polysilicon material 322 being formed on the first sidewall 319 of the dielectric material 306 and the second sidewall 321 of the dielectric material 306. The polysilicon material 322 may be examples of the polysilicon material 308 as described with reference to FIG. 3.

Figure 7:
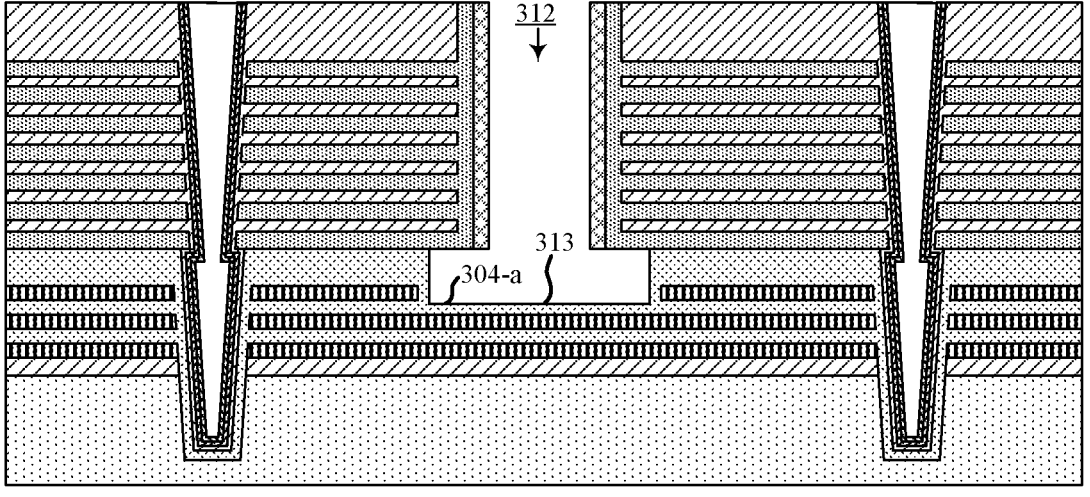

FIG. 7 illustrates an example of a cross-sectional view of a memory architecture 300 after one or more manufacturing operations in accordance with examples as disclosed herein. In the following description of FIG. 7, although some elements included in FIG. 7 are labeled with a numeric indicator, some other corresponding elements are not labeled, even though they are the same or would be understood to be similar with reference to FIGS. 3 through 6, in an effort to increase visibility and clarity of the depicted features. Additionally, in the following description of FIG. 7, some manufacturing operations may be performed in a different order than the example order described, or some manufacturing operations may be performed in different orders or at different times. Some manufacturing operations may also be omitted with reference to FIG. 7, and other manufacturing operations may be added with reference to FIG. 7. In the example of FIG. 7, one or more of the manufacturing operations may include removing the spacer material positioned at the bottom wall of the trench 312 exposing a first oxide material 304-*a*. The first oxide material 304-*a* forming the bottom wall 313 of the trench 312.

Figure 8:
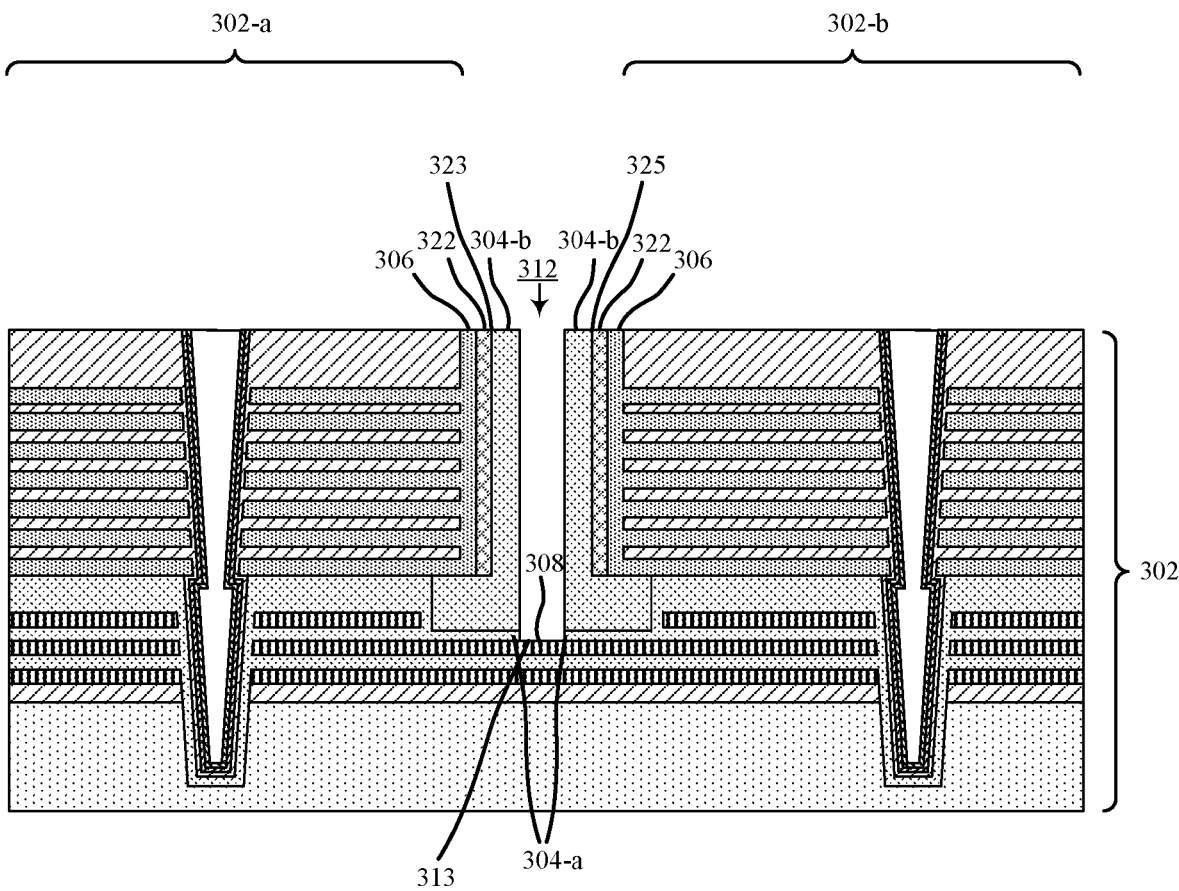

FIG. 8 illustrates an example of a cross-sectional view of a memory architecture 300 after one or more manufacturing operations in accordance with examples as disclosed herein. In the following description of FIG. 8, although some elements included in FIG. 8 are labeled with a numeric indicator, some other corresponding elements are not labeled, even though they are the same or would be understood to be similar with reference to FIGS. 3 through 7, in an effort to increase visibility and clarity of the depicted features. Additionally, in the following description of FIG. 8, some manufacturing operations may be performed in a different order than the example order described, or some manufacturing operations may be performed in different orders or at different times. Some manufacturing operations may also be omitted with reference to FIG. 8, and other manufacturing operations may be added with reference to FIG. 8.

One or more of the manufacturing operations may include depositing a second oxide material 304-*b* into the trench 312. The second oxide material 304-*b* may be in contact with a first sidewall 323 of the second polysilicon material 322 associated with the first portion 302-*a* of the stack 302, and the second oxide material 304-*b* may be in contact with a second sidewall 325 of the second polysilicon material 322 associated with the second portion 302-*b* of the stack 302. In some example, one or more of the manufacturing operations may include depositing the second oxide material 304-*b* into the trench 312 and subsequently performing an etching operation, such as a dry etching that results in the second oxide material 304-*b* in contact with the first sidewall 323 of the second polysilicon material 322 and the second oxide material 304-*b* in contact with the second sidewall 325 of the second polysilicon material 322.

Additionally, in the example of FIG. 8, one or more of the manufacturing operations may include removing the first oxide material 304-*a* and the second oxide material 304-*b* to reform the trench 312 and to expose a polysilicon material 308 at the bottom wall 313 of the trench 312.

Figure 9:
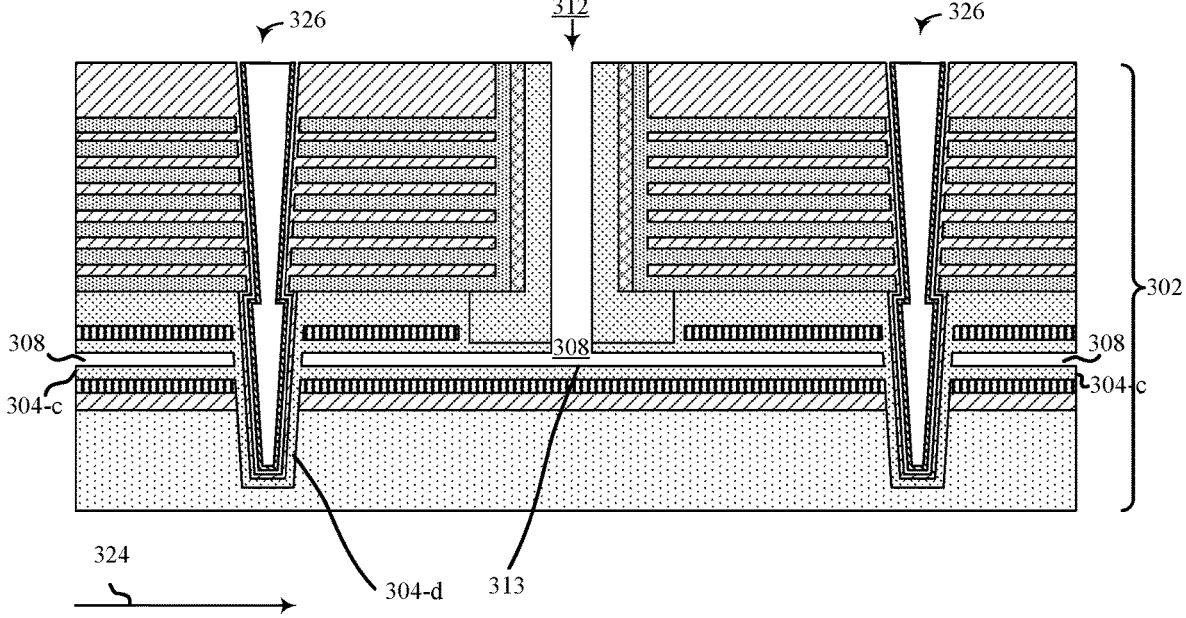

FIG. 9 illustrates an example of a cross-sectional view of a memory architecture 300 after one or more manufacturing operations in accordance with examples as disclosed herein. In the following description of FIG. 9, although some elements included in FIG. 9 are labeled with a numeric indicator, some other corresponding elements are not labeled, even though they are the same or would be understood to be similar with reference to FIGS. 3 through 8, in an effort to increase visibility and clarity of the depicted features. Additionally, in the following description of FIG. 9, some manufacturing operations may be performed in a different order than the example order described, or some manufacturing operations may be performed in different orders or at different times. Some manufacturing operations may also be omitted with reference to FIG. 9, and other manufacturing operations may be added with reference to FIG. 9. One or more of the manufacturing operations may include removing the polysilicon material 308 in a lateral direction 324 (e.g., an x-direction) to expose a third oxide material 304-*c* and a channel structure 326. For example, one or more of the manufacturing operations may include exhuming the polysilicon material 308 in the lateral direction 324 to expose the third oxide material 304-c and the channel structure 326. In some example, a wet etch operation may be used to remove materials in the lateral direction. The third oxide material 304-c may form the bottom wall 313 of the trench 312. The channel structure 326 and the stack 302 may form one or multiple memory cells.

Figure 10:
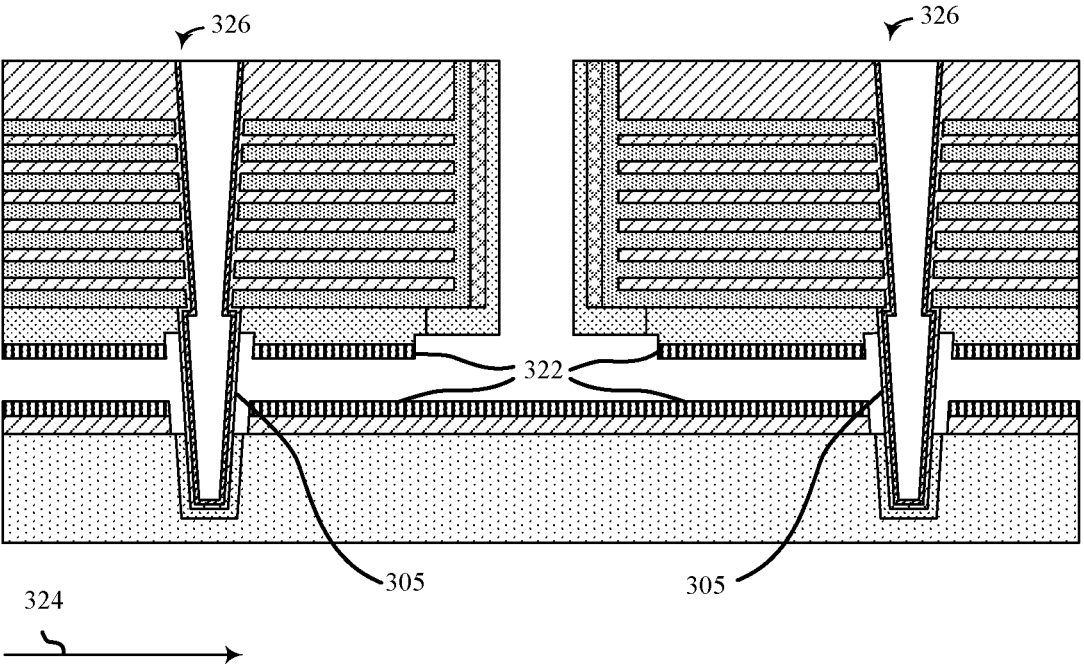

FIG. 10 illustrates an example of a cross-sectional view of a memory architecture 300 after one or more manufacturing operations in accordance with examples as disclosed herein. In the following description of FIG. 10, although some elements included in FIG. 10 are labeled with a numeric indicator, some other corresponding elements are not labeled, even though they are the same or would be understood to be similar with reference to FIGS. 3 through 9, in an effort to increase visibility and clarity of the depicted features. Additionally, in the following description of FIG. 10, some manufacturing operations may be performed in a different order than the example order described, or some manufacturing operations may be performed in different orders or at different times. Some manufacturing operations may also be omitted with reference to FIG. 10, and other manufacturing operations may be added with reference to FIG. 10.

One or more of the manufacturing operations may include removing, in a lateral direction 324 (e.g., an x-direction), the first oxide material 304-a, a portion of the second oxide material 304-b, the third oxide material 304-c, and a fourth oxide material 304-d of the channel structure 326. Thereby, one or more of the manufacturing operations may include etching one or more oxide materials between the polysilicon materials 322 and cutting a cell blocking oxide material. Additionally, one or more of the manufacturing operations may include removing a nitride material 305 of the channel structure 326 to expose a doped polysilicon material of the channel structure 326. One or more of the manufacturing operations may include removing a nitride material 305 of the channel structure 326 to expose the doped polysilicon material 322 of the channel structure 326 based on removing the first oxide material 304-a, the portion of the second oxide material 304-b, the third oxide material 304-c, and the fourth oxide material 304-d.

Figure 11:
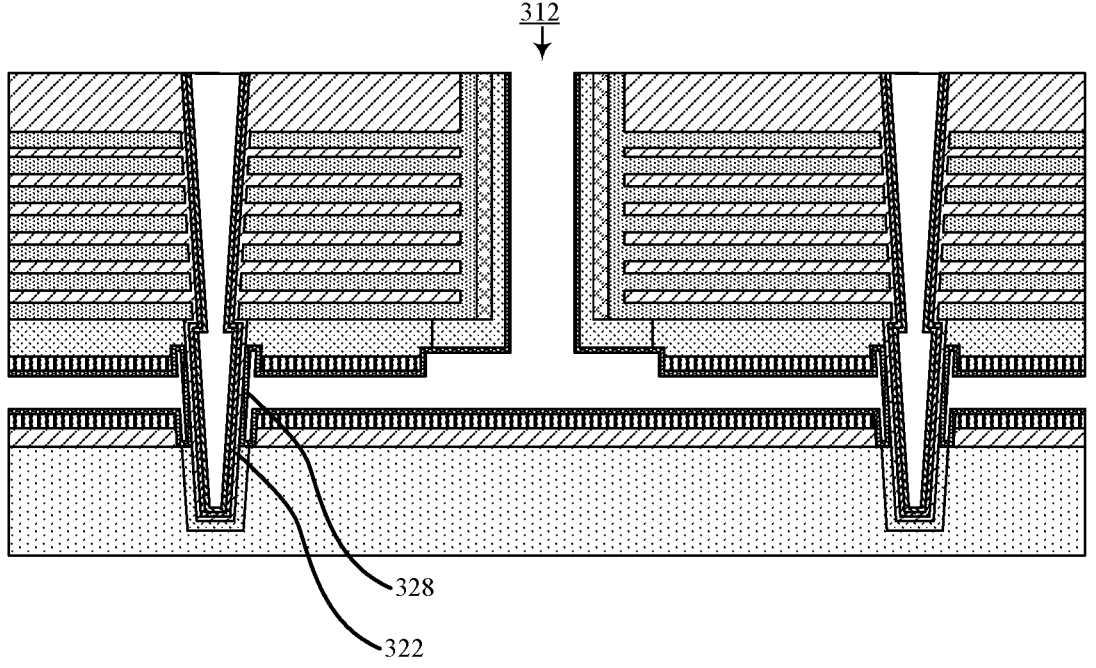

FIG. 11 illustrates an example of a cross-sectional view of a memory architecture 300 after one or more manufacturing operations in accordance with examples as disclosed herein. In the following description of FIG. 11, although some elements included in FIG. 11 are labeled with a numeric indicator, some other corresponding elements are not labeled, even though they are the same or would be understood to be similar with reference to FIGS. 3 through 10, in an effort to increase visibility and clarity of the depicted features. Additionally, in the following description of FIG. 11, some manufacturing operations may be performed in a different order than the example order described, or some manufacturing operations may be performed in different orders or at different times. Some manufacturing operations may also be omitted with reference to FIG. 11, and other manufacturing operations may be added with reference to FIG. 11. One or more of the manufacturing operations may include depositing a phosphorus material 328 into the trench 312 and in contact with the doped polysilicon material 322 of the channel structure 326. The phosphorus material 328 used for further doping the polysilicon material 322 of the channel structure 326. For example, one or more of the manufacturing operations may include depositing phosphorus rich oxide to dope the exposed channel polysilicon material 322.

Figure 12:
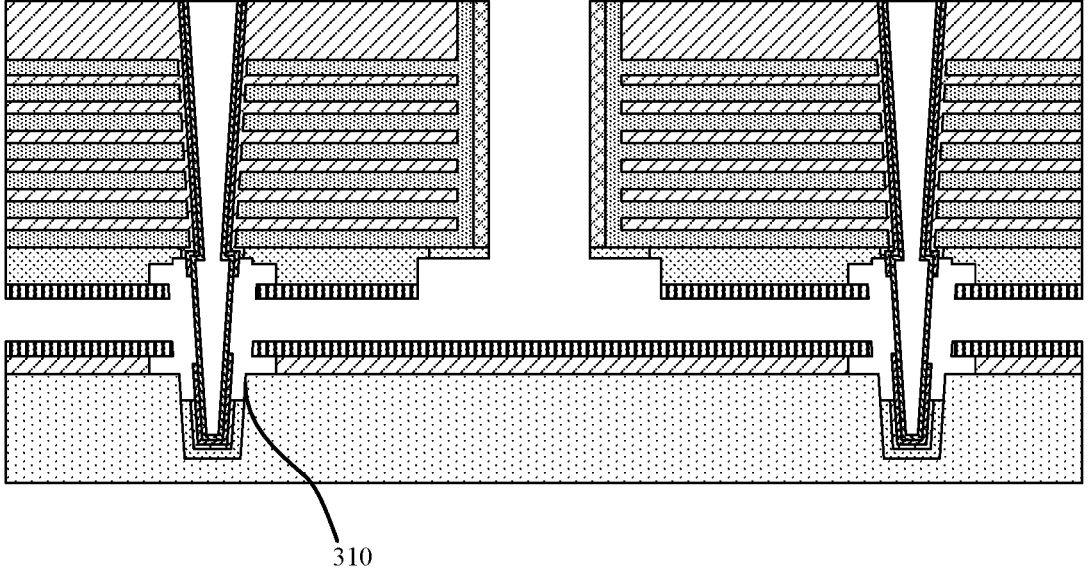

FIG. 12 illustrates an example of a cross-sectional view of a memory architecture 300 after one or more manufacturing operations in accordance with examples as disclosed herein. In the following description of FIG. 12, although some elements included in FIG. 12 are labeled with a numeric indicator, some other corresponding elements are not labeled, even though they are the same or would be understood to be similar with reference to FIGS. 3 through 11, in an effort to increase visibility and clarity of the depicted features. Additionally, in the following description of FIG. 12, some manufacturing operations may be performed in a different order than the example order described, or some manufacturing operations may be performed in different orders or at different times. Some manufacturing operations may also be omitted with reference to FIG. 12, and other manufacturing operations may be added with reference to FIG. 12. With reference to FIGS. 11 and 12, one or more of the manufacturing operations may include removing the phosphorus material 328 to expose the doped polysilicon material 322 of the channel structure 326. As such, one or more of the manufacturing operations may include etching the phosphorus material 328 (e.g., phosphorous rich oxide) and recess oxide exposing the metal material 310.

Figure 13:
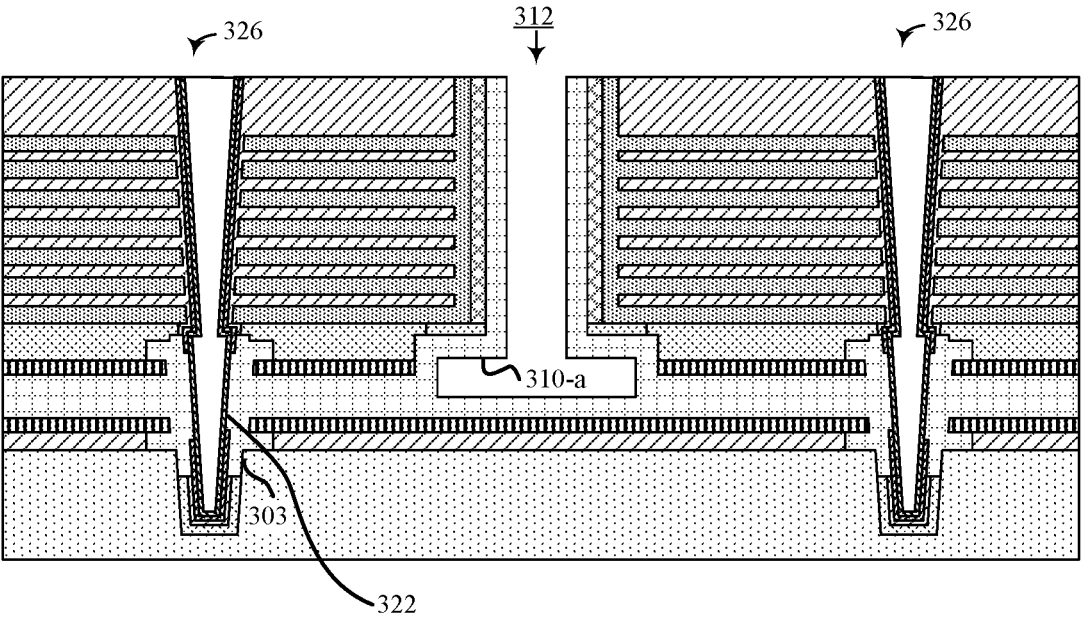

FIG. 13 illustrates an example of a cross-sectional view of a memory architecture 300 after one or more manufacturing operations in accordance with examples as disclosed herein. In the following description of FIG. 13, although some elements included in FIG. 13 are labeled with a numeric indicator, some other corresponding elements are not labeled, even though they are the same or would be understood to be similar with reference to FIGS. 3 through 12, in an effort to increase visibility and clarity of the depicted features. Additionally, in the following description of FIG. 13, some manufacturing operations may be performed in a different order than the example order described, or some manufacturing operations may be performed in different orders or at different times. Some manufacturing operations may also be omitted with reference to FIG. 13, and other manufacturing operations may be added with reference to FIG. 13. One or more of the manufacturing operations may include depositing a metal material 310-a in the trench 312. The metal material 310-a may be in contact with a doped polysilicon material 322 of the channel structure 326. For example, one or more of the manufacturing operations may include depositing titanium (Ti), TiN, or W into the trench 312. The metal material 310-a may be in contact with one or more elements of the channel structure 326, such as a polysilicon material, a nitride material, or any combination thereof. Additionally or alternatively, the metal material 310-a may be in contact with a metal material 310 of the bottom layer 303. By configuring the memory architecture 300, such that the metal material 310-a may be in contact with one or more elements of the channel structure 326 and be in contact with a metal material 310 of the bottom layer 303 may reduce the resistance associated with the channel structure 326.

Figure 14:
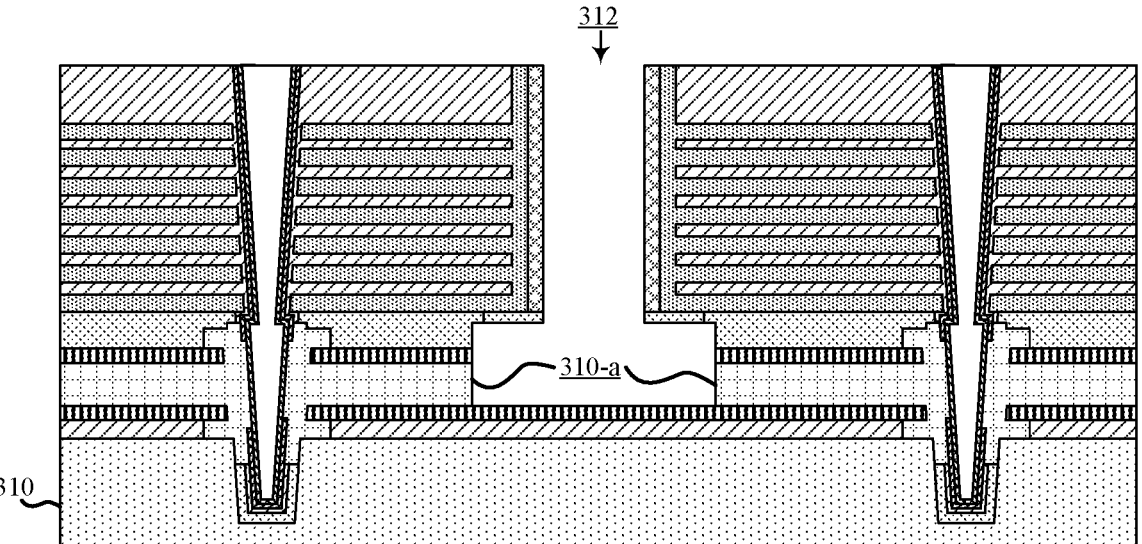

FIG. 14 illustrates an example of a cross-sectional view of a memory architecture 300 after one or more manufacturing operations in accordance with examples as disclosed herein. In the following description of FIG. 14, although some elements included in FIG. 14 are labeled with a numeric indicator, some other corresponding elements are not labeled, even though they are the same or would be understood to be similar with reference to FIGS. 3 through 13, in an effort to increase visibility and clarity of the depicted features. Additionally, in the following description of FIG. 14, some manufacturing operations may be performed in a different order than the example order described, or some manufacturing operations may be performed in different orders or at different times. Some manufacturing operations may also be omitted with reference to FIG. 14, and other manufacturing operations may be added with reference to FIG. 14. One or more of the manufacturing operations may include removing a first portion of the metal material 310-*a* and a second portion of the metal material 310-*a*. For example, one or more of the manufacturing operations may include removing the metal material 310-*a* that is in contact with one or more materials in the trench 312, for example, the polysilicon material 322.

Figure 15:
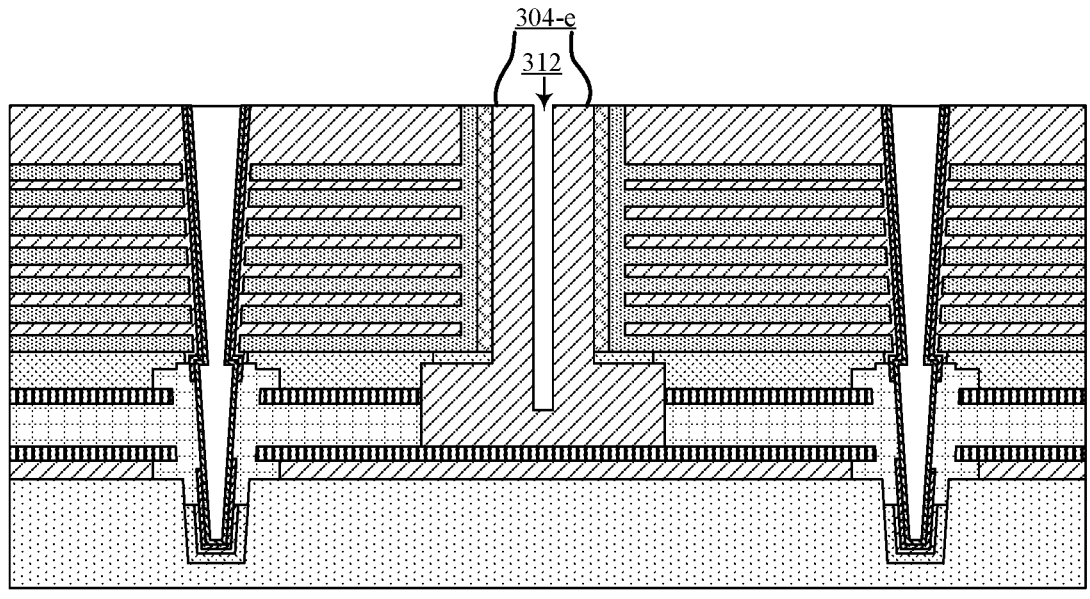
Figure 15:

FIG. 15 illustrates an example of a cross-sectional view of a memory architecture 300 after one or more manufacturing operations in accordance with examples as disclosed herein. In the following description of FIG. 15, although some elements included in FIG. 15 are labeled with a numeric indicator, some other corresponding elements are not labeled, even though they are the same or would be understood to be similar with reference to FIGS. 3 through 14, in an effort to increase visibility and clarity of the depicted features. Additionally, in the following description of FIG. 15, some manufacturing operations may be performed in a different order than the example order described, or some manufacturing operations may be performed in different orders or at different times. Some manufacturing operations may also be omitted with reference to FIG. 15, and other manufacturing operations may be added with reference to FIG. 15. In the example of FIG. 15, one or more of the manufacturing operations may include depositing a fifth oxide material 304-*e* into the trench 312 based at least in part on depositing the metal material 310-*a* in the trench 312.

Figure 16:
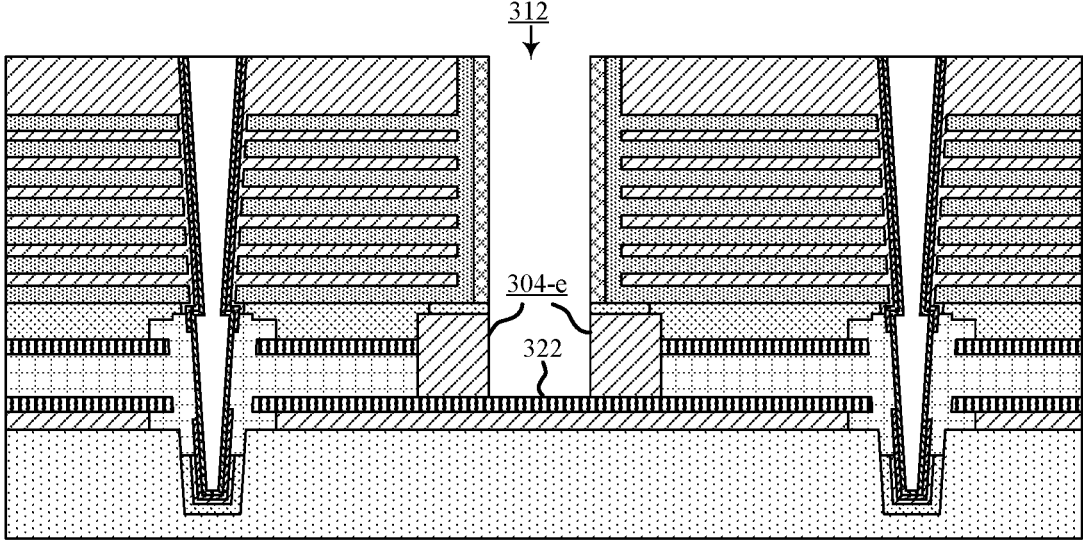
Figure 16:

FIG. 16 illustrates an example of a cross-sectional view of a memory architecture 300 after one or more manufacturing operations in accordance with examples as disclosed herein. In the following description of FIG. 16, although some elements included in FIG. 16 are labeled with a numeric indicator, some other corresponding elements are not labeled, even though they are the same or would be understood to be similar with reference to FIGS. 3 through 15, in an effort to increase visibility and clarity of the depicted features. Additionally, in the following description of FIG. 16, some manufacturing operations may be performed in a different order than the example order described, or some manufacturing operations may be performed in different orders or at different times. Some manufacturing operations may also be omitted with reference to FIG. 16, and other manufacturing operations may be added with reference to FIG. 16. One or more of the manufacturing operations may include removing the fifth oxide material 304-*e* to reform the trench 312 and exposing a polysilicon material 322 as the bottom wall of the trench 312. For example, one or more of the manufacturing operations may include etching the fifth oxide material 304-*e* back to expose the polysilicon material 322.

Figure 17:
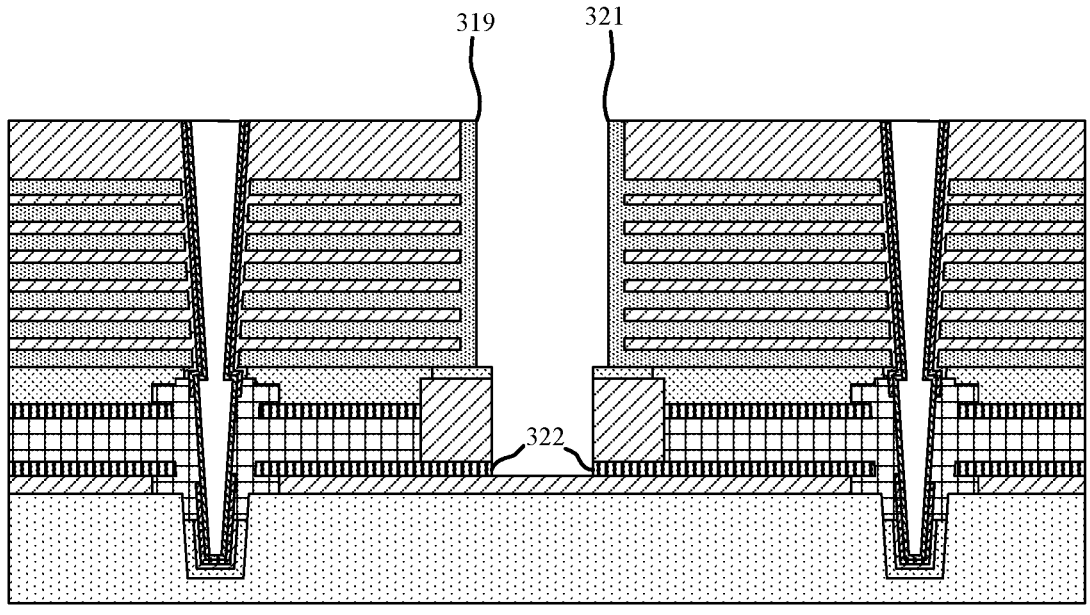

FIG. 17 illustrates an example of a cross-sectional view of a memory architecture 300 after one or more manufacturing operations in accordance with examples as disclosed herein. In the following description of FIG. 17, although some elements included in FIG. 17 are labeled with a numeric indicator, some other corresponding elements are not labeled, even though they are the same or would be understood to be similar with reference to FIGS. 3 through 16, in an effort to increase visibility and clarity of the depicted features. Additionally, in the following description of FIG. 17, some manufacturing operations may be performed in a different order than the example order described, or some manufacturing operations may be performed in different orders or at different times. Some manufacturing operations may also be omitted with reference to FIG. 17, and other manufacturing operations may be added with reference to FIG. 17. One or more of the manufacturing operations may include removing, based on removing the fifth oxide material 304-*e*, a portion of the polysilicon material 322 and the polysilicon material 322 on the first sidewall 319 of the dielectric material 306 and the polysilicon material 322 on the second sidewall 321 of the dielectric material 306.

Figure 18:
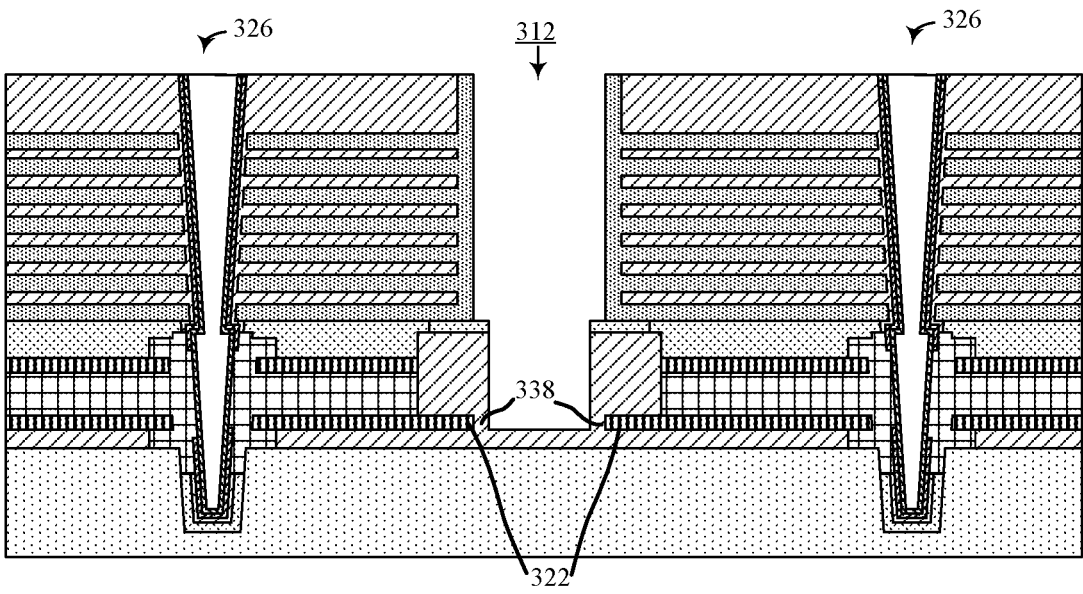
Figure 18:

FIG. 18 illustrates an example of a cross-sectional view of a memory architecture 300 after one or more manufacturing operations in accordance with examples as disclosed herein. In the following description of FIG. 18, although some elements included in FIG. 18 are labeled with a numeric indicator, some other corresponding elements are not labeled, even though they are the same or would be understood to be similar with reference to FIGS. 3 through 17, in an effort to increase visibility and clarity of the depicted features. Additionally, in the following description of FIG. 18, some manufacturing operations may be performed in a different order than the example order described, or some manufacturing operations may be performed in different orders or at different times. Some manufacturing operations may also be omitted with reference to FIG. 18, and other manufacturing operations may be added with reference to FIG. 18. One or more of the manufacturing operations may include performing an oxidation operation 328 on exposed portions of the polysilicon material 322 to isolate the channel structure 326 from the trench 312. Put another way, one or more of the manufacturing operations may include oxidizing exposed polysilicon material 322.

Figure 19:
Figure 19:
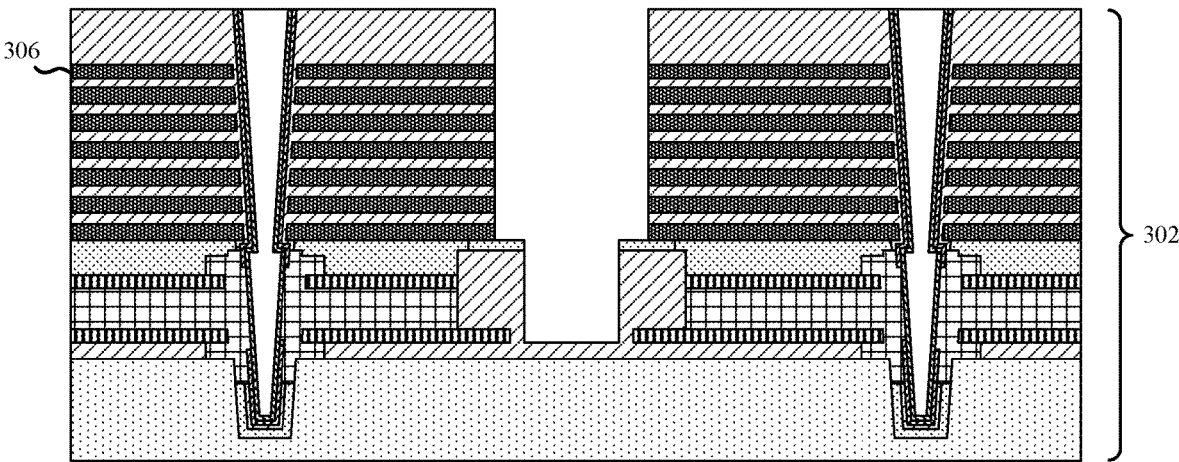

FIG. 19 illustrates an example of a cross-sectional view of a memory architecture 300 after one or more manufacturing operations in accordance with examples as disclosed herein. In the following description of FIG. 19, although some elements included in FIG. 19 are labeled with a numeric indicator, some other corresponding elements are not labeled, even though they are the same or would be understood to be similar with reference to FIGS. 3 through 18, in an effort to increase visibility and clarity of the depicted features. Additionally, in the following description of FIG. 19, some manufacturing operations may be performed in a different order than the example order described, or some manufacturing operations may be performed in different orders or at different times. Some manufacturing operations may also be omitted with reference to FIG. 19, and other manufacturing operations may be added with reference to FIG. 19. One or more of the manufacturing operations may include performing a dielectric exhume operation 332 of one or more dielectric materials 306 in the stack 302 to form one or more memory cells. For example, one or more of the manufacturing operations may include performing a nitride exhume operation of one or more dielectric materials 306 in the stack 302. After exhuming the dielectric materials, a conductive material may be positioned in the locations where the dielectric materials once were. The channel structure and the added conductive materials may be configured to form memory cells where the conductive materials and the channel structure are positioned near one another.

Figure 20:
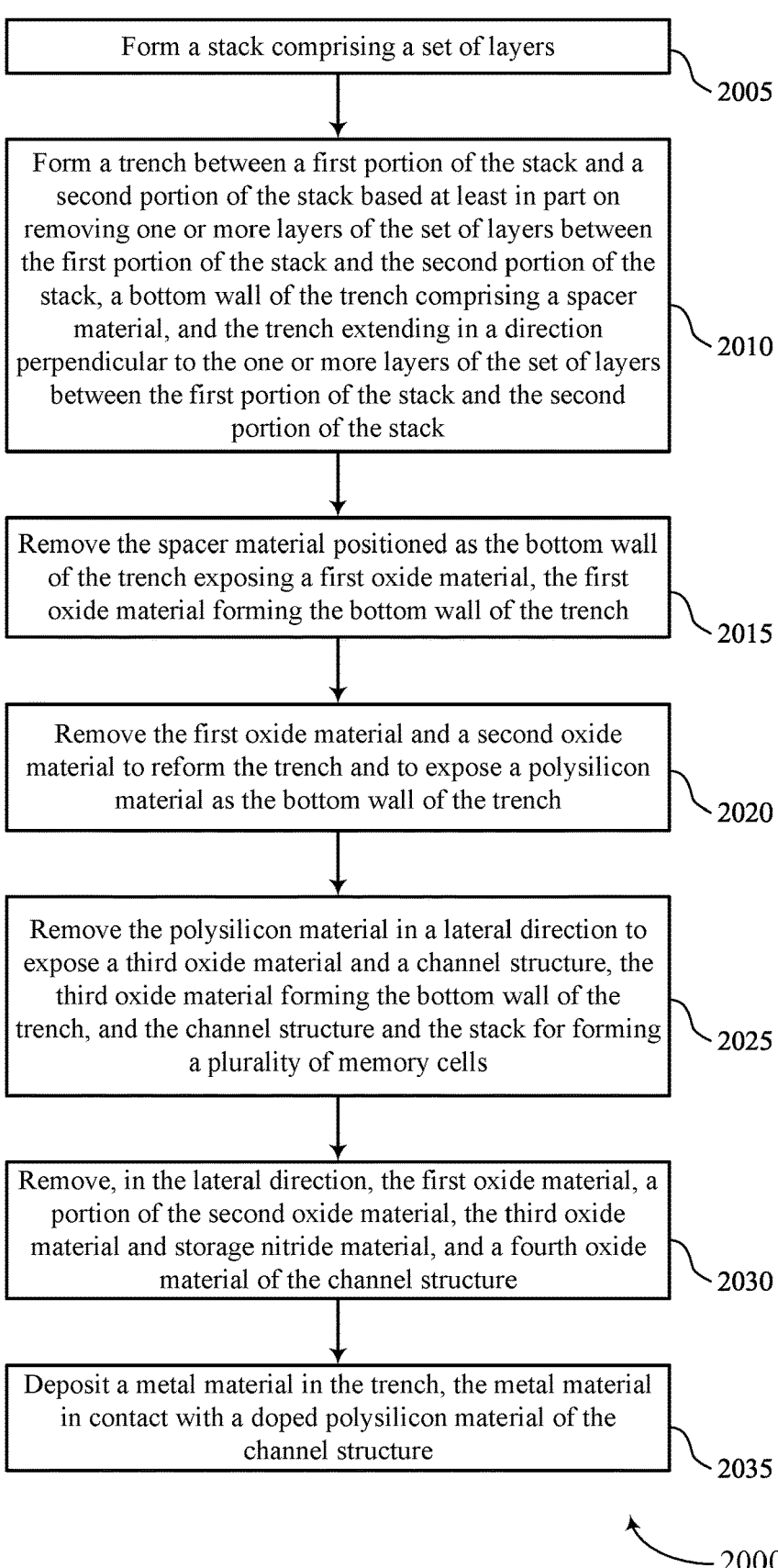

FIG. 20 shows a flowchart illustrating a method 2000 that supports vertical non-volatile memory with low resistance source contact in accordance with examples as disclosed herein. The operations of method 2000 may be implemented by a manufacturing system or its components as described herein. For example, the operations of method 2000 may be performed by a manufacturing system as described with reference to FIGS. 1 through 19. In some examples, a manufacturing system may execute a set of instructions to control the functional elements of the manufacturing system to perform the described functions. Additionally, or alternatively, the manufacturing system may perform aspects of the described functions using special-purpose hardware.

At 2005, the method may include forming a stack including a set of layers. The operations of 2005 may be performed in accordance with examples as disclosed herein.

At 2010, the method may include forming a trench between a first portion of the stack and a second portion of the stack based at least in part on removing one or more layers of the set of layers between the first portion of the stack and the second portion of the stack, a bottom wall of the trench including a spacer material, and the trench extending in a direction perpendicular to the one or more layers of the set of layers between the first portion of the stack and the second portion of the stack. The operations of 2010 may be performed in accordance with examples as disclosed herein.

At 2015, the method may include removing the spacer material positioned as the bottom wall of the trench exposing a first oxide material, the first oxide material forming the bottom wall of the trench. The operations of 2015 may be performed in accordance with examples as disclosed herein.

At 2020, the method may include removing the first oxide material and a second oxide material to reform the trench and to expose a polysilicon material as the bottom wall of the trench. The operations of 2020 may be performed in accordance with examples as disclosed herein.

At 2025, the method may include removing the polysilicon material in a lateral direction to expose a third oxide material and a channel structure, the third oxide material forming the bottom wall of the trench, and the channel structure and the stack for forming a plurality of memory cells. The operations of 2025 may be performed in accordance with examples as disclosed herein.

At 2030, the method may include removing, in the lateral direction, the first oxide material, a portion of the second oxide material, the third oxide material and storage nitride material, and a fourth oxide material of the channel structure. The operations of 2030 may be performed in accordance with examples as disclosed herein.

At 2035, the method may include depositing a metal material in the trench, the metal material in contact with a doped polysilicon material of the channel structure. The operations of 2035 may be performed in accordance with examples as disclosed herein.

In some examples, an apparatus (e.g., a manufacturing system) as described herein may perform a method or methods, such as the method 2000. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming a stack including a set of layers; forming a trench between a first portion of the stack and a second portion of the stack based at least in part on removing one or more layers of the set of layers between the first portion of the stack and the second portion of the stack, a bottom wall of the trench including a spacer material, and the trench extending in a direction perpendicular to the one or more layers of the set of layers between the first portion of the stack and the second portion of the stack; removing the spacer material positioned as the bottom wall of the trench exposing a first oxide material, the first oxide material forming the bottom wall of the trench; removing the first oxide material and a second oxide material to reform the trench and to expose a polysilicon material as the bottom wall of the trench; removing the polysilicon material in a lateral direction to expose a third oxide material and a channel structure, the third oxide material forming the bottom wall of the trench, and the channel structure and the stack for forming a plurality of memory cells; removing, in the lateral direction, the first oxide material, a portion of the second oxide material, the third oxide material and storage nitride material, and a fourth oxide material of the channel structure; and depositing a metal material in the trench, the metal material in contact with a doped polysilicon material of the channel structure.

Aspect 2: The method or apparatus of aspect 1, further including operations, features, circuitry, logic, means, or instructions, or any combination thereof for removing a nitride material of the channel structure to expose the doped polysilicon material of the channel structure based at least in part on removing the first oxide material, the portion of the second oxide material, the third oxide material, and the fourth oxide material and where depositing the metal material is based at least in part on removing the nitride material.

Aspect 3: The method or apparatus of aspect 2, further including operations, features, circuitry, logic, means, or instructions, or any combination thereof for depositing a phosphorus material into the trench and in contact with the doped polysilicon material of the channel structure, the phosphorus material for further doping the polysilicon material of the channel structure.

Aspect 4: The method or apparatus of any of aspects 2 through 3, further including operations, features, circuitry, logic, means, or instructions, or any combination thereof for removing the phosphorus material to expose the doped polysilicon material of the channel structure, where depositing the metal material is based at least in part on removing the nitride material.

Aspect 5: The method or apparatus of any of aspects 1 through 4, further including operations, features, circuitry, logic, means, or instructions, or any combination thereof for depositing, based at least in part on forming the trench, a dielectric material on a first sidewall of the trench formed by the first portion of the stack and the dielectric material on a second sidewall of the trench formed by the second portion of the stack, where removing the spacer material is based at least in part on depositing the dielectric material.

Aspect 6: The method or apparatus of aspect 5, further including operations, features, circuitry, logic, means, or instructions, or any combination thereof for depositing a second polysilicon material on a first sidewall of the dielectric material and a second sidewall of the dielectric material based at least in part on depositing the dielectric material into the trench, where removing the spacer material is based at least in part on depositing the second polysilicon material.

Aspect 7: The method or apparatus of aspect 6, further including operations, features, circuitry, logic, means, or instructions, or any combination thereof for depositing, based at least in part on depositing the second polysilicon material, the second oxide material into the trench, the second oxide material in contact with a first sidewall of the second polysilicon material on the first sidewall of the dielectric material on the first sidewall of the first portion of the stack, and the second oxide material in contact with a second sidewall of the second polysilicon material on the second sidewall of the dielectric material on the second sidewall of the second portion of the stack, where removing the first oxide material and the second oxide material is based at least in part on depositing the second oxide material.

Aspect 8: The method or apparatus of aspect 7, further including operations, features, circuitry, logic, means, or instructions, or any combination thereof for depositing a fifth oxide material into the trench based at least in part on depositing the metal material in the trench and removing the fifth oxide material to reform the trench and expose a third polysilicon material as the bottom wall of the trench and expose the second polysilicon material.

Aspect 9: The method or apparatus of aspect 8, further including operations, features, circuitry, logic, means, or instructions, or any combination thereof for oxidizing, based at least in part on removing the fifth oxide material, a portion of the third polysilicon material and the second polysilicon material on the first sidewall of the dielectric material on the first sidewall of the first portion of the stack and the second polysilicon material on the second sidewall of the dielectric material on the second sidewall of the second portion of the stack.

Aspect 10: The method or apparatus of aspect 9, further including operations, features, circuitry, logic, means, or instructions, or any combination thereof for performing an oxidation operation on exposed portions of the third polysilicon material to isolate the channel structure from the trench based at least in part on oxidizing the portion of the third polysilicon material.

Aspect 11: The method or apparatus of any of aspects 6 through 10, further including operations, features, circuitry, logic, means, or instructions, or any combination thereof for removing, based at least in part on the first oxide material, the portion of the second oxide material, the third oxide material, and the fourth oxide material, a second portion of the second oxide material to expose the second polysilicon material on the first sidewall of the dielectric material on the first sidewall of the first portion of the stack and the second polysilicon material on the second sidewall of the dielectric material on the second sidewall of the second portion of the stack, where depositing the metal material is based at least in part on removing the second portion of the second oxide material.

Aspect 12: The method or apparatus of any of aspects 1 through 11, further including operations, features, circuitry, logic, means, or instructions, or any combination thereof for removing a first portion of the metal material and a second portion of the metal material based at least in part on depositing the metal material.

Aspect 13: The method or apparatus of any of aspects 1 through 12, further including operations, features, circuitry, logic, means, or instructions, or any combination thereof for performing a dielectric exhume operation of one or more dielectric materials in the stack to form one or more memory cells.

FIG. 21 shows a flowchart illustrating a method 2100 that supports vertical non-volatile memory with low resistance source contact in accordance with examples as disclosed herein. The operations of method 2100 may be implemented by a manufacturing system or its components as described herein. For example, the operations of method 2100 may be performed by a manufacturing system as described with reference to FIGS. 1 through 19. In some examples, a manufacturing system may execute a set of instructions to control the functional elements of the manufacturing system to perform the described functions. Additionally, or alternatively, the manufacturing system may perform aspects of the described functions using special-purpose hardware.

At 2105, the method may include forming a trench between a first portion of a stack and a second portion of the stack, a bottom wall of the trench including a spacer material, and the trench extending in a direction perpendicular to one or more layers between the first portion of the stack and the second portion of the stack. The operations of 2105 may be performed in accordance with examples as disclosed herein.

At 2110, the method may include removing a first oxide material and a second oxide material to reform the trench. The operations of 2110 may be performed in accordance with examples as disclosed herein.

At 2115, the method may include removing a polysilicon material in a lateral direction to expose a third oxide material and a channel structure, the third oxide material forming the bottom wall of the trench. The operations of 2115 may be performed in accordance with examples as disclosed herein.

At 2120, the method may include removing, in the lateral direction, the first oxide material, a portion of the second oxide material, the third oxide material and storage nitride material, and a fourth oxide material of the channel structure. The operations of 2120 may be performed in accordance with examples as disclosed herein.

At 2125, the method may include depositing a metal material in the trench, the metal material in contact with a doped polysilicon material of the channel structure. The operations of 2125 may be performed in accordance with examples as disclosed herein.

In some examples, an apparatus (e.g., a manufacturing system) as described herein may perform a method or methods, such as the method 2100. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 14: A method or apparatus including operations, features, circuitry, logic, means, or instructions, or any combination thereof for forming a trench between a first portion of a stack and a second portion of the stack, a bottom wall of the trench including a spacer material, and the trench extending in a direction perpendicular to one or more layers between the first portion of the stack and the second portion of the stack; removing a first oxide material and a second oxide material to reform the trench; removing a polysilicon material in a lateral direction to expose a third oxide material and a channel structure, the third oxide material forming the bottom wall of the trench; removing, in the lateral direction, the first oxide material, a portion of the second oxide material, the third oxide material and storage nitride material, and a fourth oxide material of the channel structure; and depositing a metal material in the trench, the metal material in contact with a doped polysilicon material of the channel structure.

Aspect 15: The method or apparatus of aspect 14, further including operations, features, circuitry, logic, means, or instructions, or any combination thereof for removing the spacer material positioned as the bottom wall of the trench exposing the first oxide material.

Aspect 16: method or apparatus of any of aspects 14 through 15, further including operations, features, circuitry, logic, means, or instructions, or any combination thereof for removing a nitride material of the channel structure to expose the doped polysilicon material of the channel structure based at least in part on removing the first oxide material, the portion of the second oxide material, the third oxide material, and the fourth oxide material, where depositing the metal material is based at least in part on removing the nitride material.

Aspect 17: The method or apparatus of aspect 16, further including operations, features, circuitry, logic, means, or instructions, or any combination thereof for depositing a phosphorus material into the trench and in contact with the doped polysilicon material of the channel structure.

Aspect 18: The method or apparatus of any of aspects 16 through 17, further including operations, features, circuitry, logic, means, or instructions, or any combination thereof for removing the phosphorus material to expose the doped polysilicon material of the channel structure, where depositing the metal material is based at least in part on removing the nitride material.

Aspect 19: The method or apparatus of aspects 14 through 18, further including operations, features, circuitry, logic, means, or instructions, or any combination thereof for depositing, based at least in part on forming the trench, a dielectric material on a first sidewall of the trench formed by the first portion of the stack and the dielectric material on a second sidewall of the trench formed by the second portion of the stack, where removing the spacer material is based at least in part on depositing the dielectric material.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 20: An apparatus, including: a memory cell including: a stack including a set of layers; and a trench between a first portion of the stack and a second portion of the stack, where a bottom wall of the trench includes an oxide material, where the trench extends in a direction perpendicular to one or more layers of the set of layers between the first portion of the stack and the second portion of the stack, where a pair of sidewalls of the trench include a polysilicon material or an oxide material, or both, where the trench includes deposited metal material in contact with a doped polysilicon material of a channel structure of the memory cell.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

As used herein, the term "removing" and "oxidizing" may be used interchangeably.

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:

forming a stack comprising a set of layers;

forming a trench between a first portion of the stack and a second portion of the stack based at least in part on removing one or more layers of the set of layers between the first portion of the stack and the second portion of the stack, a bottom wall of the trench comprising a spacer material, and the trench extending in a direction perpendicular to the one or more layers of the set of layers between the first portion of the stack and the second portion of the stack;

removing the spacer material positioned as the bottom wall of the trench exposing a first oxide material, the first oxide material forming the bottom wall of the trench;

removing the first oxide material and a second oxide material to reform the trench and to expose a polysilicon material as the bottom wall of the trench;

removing the polysilicon material in a lateral direction to expose a third oxide material and a channel structure, the third oxide material forming the bottom wall of the trench, and the channel structure and the stack for forming a plurality of memory cells;

removing, in the lateral direction, the first oxide material, a portion of the second oxide material, the third oxide material, and a fourth oxide material of the channel structure; and depositing a metal material in the trench, the metal material in contact with a doped polysilicon material of the channel structure.

2. The method of claim 1, further comprising:

removing a nitride material of the channel structure to expose the doped polysilicon material of the channel structure based at least in part on removing the first oxide material, the portion of the second oxide material, the third oxide material, and the fourth oxide material, wherein depositing the metal material is based at least in part on removing the nitride material.

3. The method of claim 2, further comprising:

depositing a phosphorus material into the trench and in contact with the doped polysilicon material of the channel structure, the phosphorus material for further doping the polysilicon material of the channel structure.

4. The method of claim 3, further comprising:

removing the phosphorus material to expose the doped polysilicon material of the channel structure, wherein depositing the metal material is based at least in part on removing the nitride material.

5. The method of claim 1, further comprising:

depositing, based at least in part on forming the trench, a dielectric material on a first sidewall of the trench formed by the first portion of the stack and the dielectric material on a second sidewall of the trench formed by the second portion of the stack, wherein removing the spacer material is based at least in part on depositing the dielectric material.

6. The method of claim 5, further comprising:

depositing a second polysilicon material on a first sidewall of the dielectric material and a second sidewall of the dielectric material based at least in part on depositing the dielectric material into the trench, wherein removing the spacer material is based at least in part on depositing the second polysilicon material.

7. The method of claim 6, further comprising:

depositing, based at least in part on depositing the second polysilicon material, the second oxide material into the trench, the second oxide material in contact with a first sidewall of the second polysilicon material on the first sidewall of the dielectric material on the first sidewall of the first portion of the stack, and the second oxide material in contact with a second sidewall of the second polysilicon material on the second sidewall of the dielectric material on the second sidewall of the second portion of the stack, wherein removing the first oxide material and the second oxide material is based at least in part on depositing the second oxide material.

8. The method of claim 7, further comprising:

depositing a fifth oxide material into the trench based at least in part on depositing the metal material in the trench; and removing the fifth oxide material to reform the trench and expose a third polysilicon material as the bottom wall of the trench and expose the second polysilicon material.

9. The method of claim 8, further comprising:

oxidizing, based at least in part on removing the fifth oxide material, a portion of the third polysilicon material and the second polysilicon material on the first sidewall of the dielectric material on the first sidewall of the first portion of the stack and the second polysilicon material on the second sidewall of the dielectric material on the second sidewall of the second portion of the stack.

10. The method of claim 9, further comprising:

performing an oxidation operation on exposed portions of the third polysilicon material to isolate the channel structure from the trench based at least in part on oxidizing the portion of the third polysilicon material.

11. The method of claim 6, further comprising:

removing, based at least in part on the first oxide material, the portion of the second oxide material, the third oxide material, and the fourth oxide material, a second portion of the second oxide material to expose the second polysilicon material on the first sidewall of the dielectric material on the first sidewall of the first portion of the stack and the second polysilicon material on the second sidewall of the dielectric material on the second sidewall of the second portion of the stack, wherein depositing the metal material is based at least in part on removing the second portion of the second oxide material.

12. The method of claim 1, further comprising:
removing a first portion of the metal material and a second portion of the metal material based at least in part on depositing the metal material.

13. The method of claim 1, further comprising:
performing a dielectric exhume operation of one or more dielectric materials in the stack to form one or more memory cells.

14. A method, comprising:
forming a trench between a first portion of a stack and a second portion of the stack, a bottom wall of the trench comprising a spacer material, and the trench extending in a direction perpendicular to one or more layers between the first portion of the stack and the second portion of the stack;
removing a first oxide material and a second oxide material to reform the trench;
removing a polysilicon material in a lateral direction to expose a third oxide material and a channel structure, the third oxide material forming the bottom wall of the trench;
removing, in the lateral direction, the first oxide material, a portion of the second oxide material, the third oxide material, and a fourth oxide material of the channel structure; and
depositing a metal material in the trench, the metal material in contact with a doped polysilicon material of the channel structure.

15. The method of claim 14, further comprising:
removing the spacer material positioned as the bottom wall of the trench exposing the first oxide material.

16. The method of claim 14, further comprising:
removing a nitride material of the channel structure to expose the doped polysilicon material of the channel structure based at least in part on removing the first oxide material, the portion of the second oxide material, the third oxide material, and the fourth oxide material, wherein depositing the metal material is based at least in part on removing the nitride material.

17. The method of claim 16, further comprising:
depositing a phosphorus material into the trench and in contact with the doped polysilicon material of the channel structure.

18. The method of claim 17, further comprising:
removing the phosphorus material to expose the doped polysilicon material of the channel structure, wherein depositing the metal material is based at least in part on removing the nitride material.

19. The method of claim 14, further comprising:
depositing, based at least in part on forming the trench, a dielectric material on a first sidewall of the trench formed by the first portion of the stack and the dielectric material on a second sidewall of the trench formed by the second portion of the stack, wherein removing the spacer material is based at least in part on depositing the dielectric material.

20. An apparatus formed by a process comprising:
forming a trench between a first portion of a stack and a second portion of the stack, a bottom wall of the trench comprising a spacer material, and the trench extending in a direction perpendicular to one or more layers between the first portion of the stack and the second portion of the stack;
removing a first oxide material and a second oxide material to reform the trench;
removing a polysilicon material in a lateral direction to expose a third oxide material and a channel structure, the third oxide material forming the bottom wall of the trench;
removing, in the lateral direction, the first oxide material, a portion of the second oxide material, the third oxide material, and a fourth oxide material of the channel structure; and
depositing a metal material in the trench, the metal material in contact with a doped polysilicon material of the channel structure.

21. An apparatus formed by a process, comprising:
forming a stack comprising a set of layers;
forming a trench between a first portion of the stack and a second portion of the stack based at least in part on removing one or more layers of the set of layers between the first portion of the stack and the second portion of the stack, a bottom wall of the trench comprising a spacer material, and the trench extending in a direction perpendicular to the one or more layers of the set of layers between the first portion of the stack and the second portion of the stack;
removing the spacer material positioned as the bottom wall of the trench exposing a first oxide material, the first oxide material forming the bottom wall of the trench;
removing the first oxide material and a second oxide material to reform the trench and to expose a polysilicon material as the bottom wall of the trench;
removing the polysilicon material in a lateral direction to expose a third oxide material and a channel structure, the third oxide material forming the bottom wall of the trench, and the channel structure and the stack for forming a plurality of memory cells;
removing, in the lateral direction, the first oxide material, a portion of the second oxide material, the third oxide material, and a fourth oxide material of the channel structure; and
depositing a metal material in the trench, the metal material in contact with a doped polysilicon material of the channel structure.

* * * * *